United States Patent
Weiss

(10) Patent No.: US 6,622,205 B1
(45) Date of Patent: Sep. 16, 2003

(54) PROCESS FOR THE SECURE WRITING OF A POINTER FOR A CIRCULAR MEMORY

(75) Inventor: Dieter Weiss, Munich (DE)

(73) Assignee: Giesecke & Devrient GmbH, Munich (DE)

( * ) Notice: Subject to any disclaimer, the term of this patent is extended or adjusted under 35 U.S.C. 154(b) by 0 days.

(21) Appl. No.: 09/926,448

(22) PCT Filed: May 4, 2000

(86) PCT No.: PCT/EP00/03990

§ 371 (c)(1),
(2), (4) Date: Jan. 28, 2002

(87) PCT Pub. No.: WO00/68794

PCT Pub. Date: Nov. 16, 2000

(30) Foreign Application Priority Data

May 7, 1999 (DE) ............................... 199 21 232

(51) Int. Cl.[7] .............................................. G06F 12/00
(52) U.S. Cl. ....................... 711/110; 711/103; 711/115
(58) Field of Search ................... 711/110, 103, 711/115, 218, 219

(56) References Cited

U.S. PATENT DOCUMENTS

| | | | | |
|---|---|---|---|---|
| 4,566,106 A | * | 1/1986 | Check, Jr. ................... | 714/32 |
| 5,537,652 A | * | 7/1996 | Friedl et al. ................ | 711/111 |
| 5,758,330 A | * | 5/1998 | Brown ....................... | 705/405 |
| 5,781,101 A | * | 7/1998 | Stephen et al. ............. | 340/286.02 |

FOREIGN PATENT DOCUMENTS

EP   0 353 435 A  *  2/1990

* cited by examiner

Primary Examiner—Kevin Verbrugge
(74) Attorney, Agent, or Firm—Bacon & Thomas, PLLC

(57) ABSTRACT

To permit safe writing of the pointer (P) pointing to the current record in a cyclic memory or ring memory, e.g. an EEPROM, the new record (D'#3) is written to the memory location (R3) containing the oldest record, and then the pointer (P) is updated. The pointer (P) consists of a first pointer (P1, P1*) and a second pointer (P2, P2*) redundant with respect to the first pointer. Each pointer contains a check value in the form of the inverse or complement code of the actual pointer. Due to the second pointer and the check value, the pointer is written with optimal safety. In case of a disturbance in the course of pointer updating, the old first pointer can later alternatively be recovered from the second pointer or the second pointer updated with the aid of the new first pointer.

10 Claims, 2 Drawing Sheets

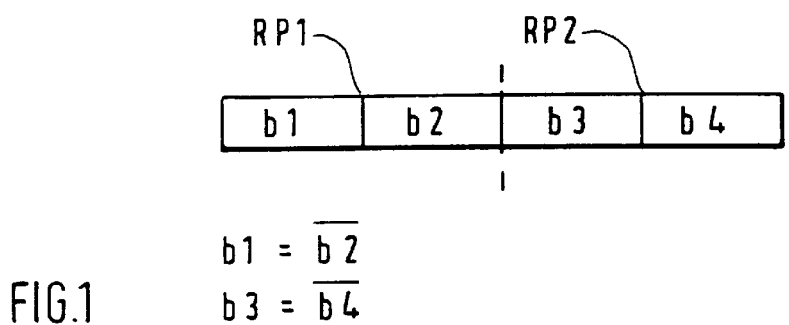
FIG.1
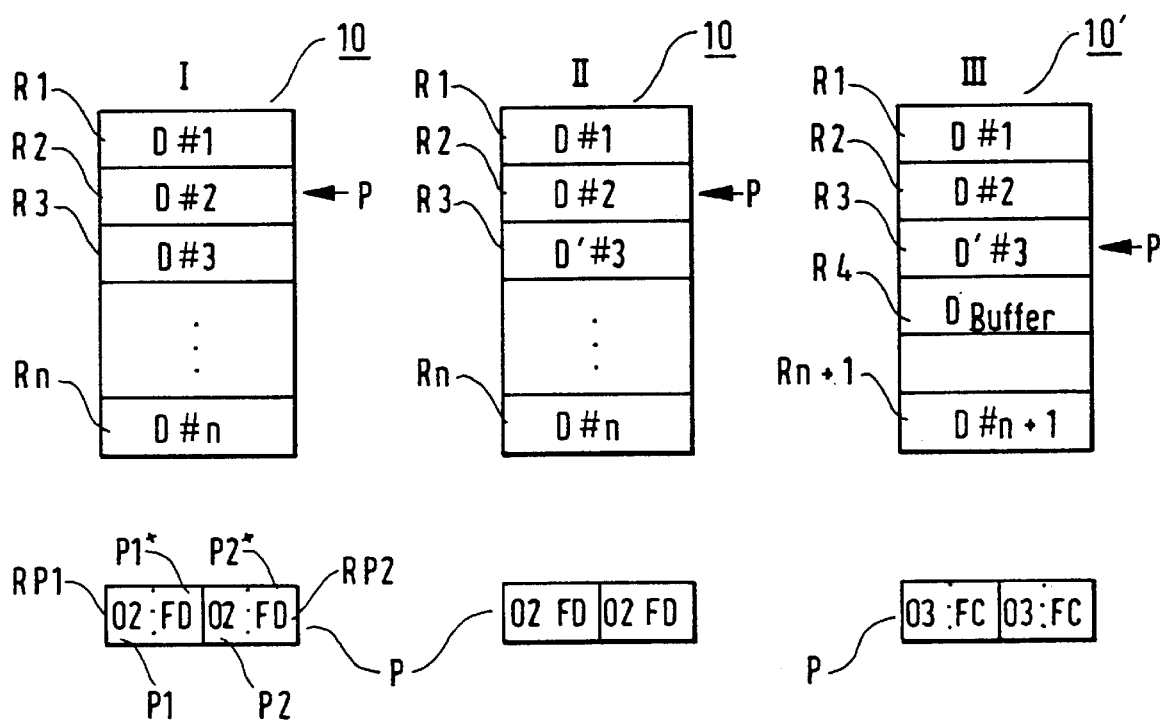
FIG.2
FIG.4

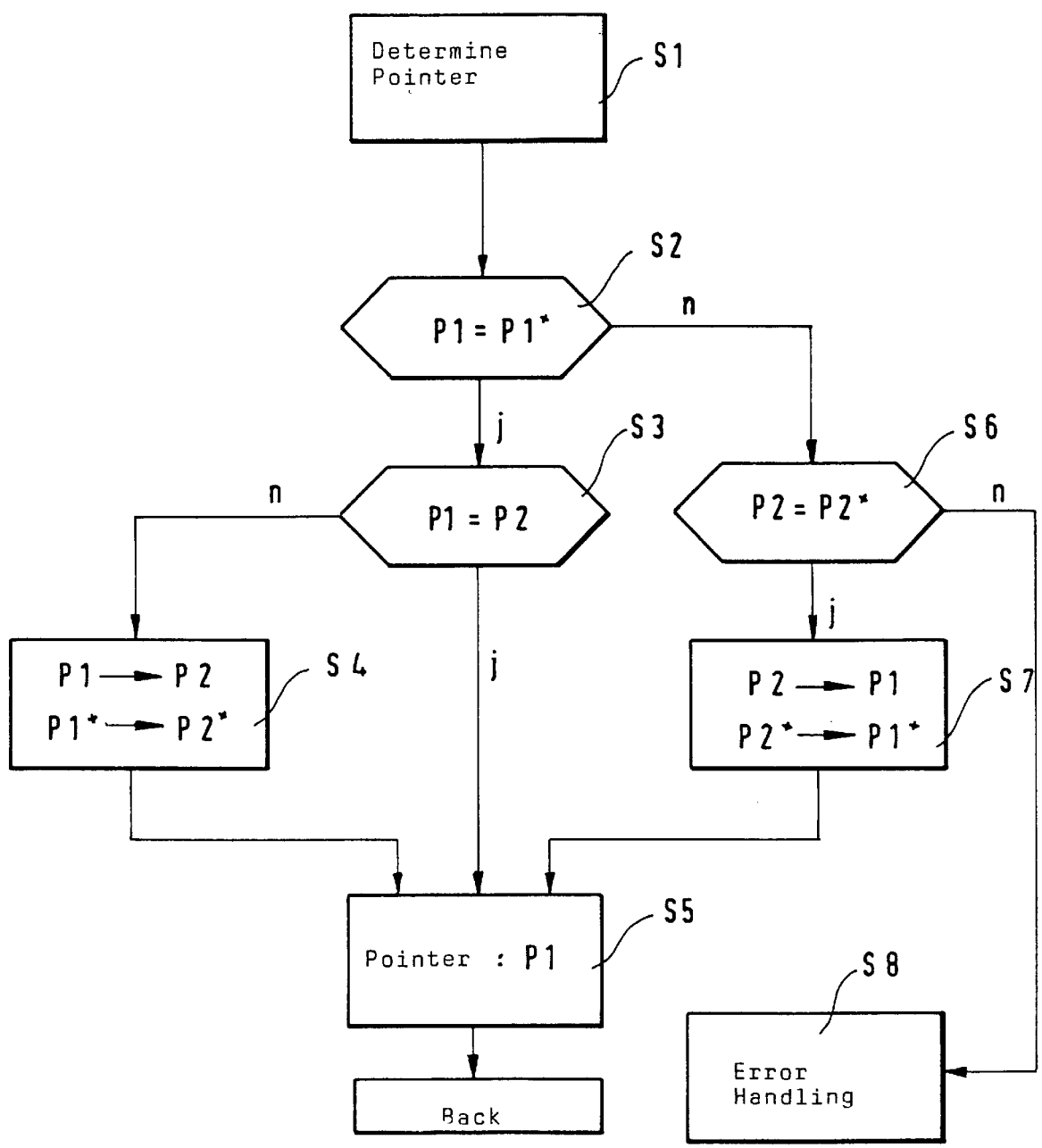

PROCESS FOR THE SECURE WRITING OF A POINTER FOR A CIRCULAR MEMORY

This invention relates to a method for safe writing of a pointer for a ring memory, further to such a ring memory having a pointer memory location and to a smart card containing such a ring memory.

Ring memories or cyclic memories, whose content is also referred to as a cyclic file or the like, can be formed as virtual memories or hardware memories. A ring memory is in particular a typical form of organization for an electrically erasable programmable read-only memory (EEPROM), to which the present invention and the presentation of examples of the invention specifically relate, although the invention can find application for ring memories in general.

A ring memory contains a given number of memory locations, the cyclic file in the ring memory containing a series of records with one record stored in one memory location in each case. The records are written cyclically one after the other to the ring memory, provided that the oldest record is always overwritten for writing a new record. With continuous numbering 1, 2, . . . n of the memory locations of the ring memory, memory location "1" cyclically follows memory location "n." The "current" or most recent record is found in a memory location that is addressed by a pointer. For writing consecutive records, the pointer is augmented—cyclically—by one memory location address at a time.

To illustrate the problem underlying the present invention, we will now take a closer look at the writing of a new record to a predetermined memory location of a ring memory formed as an EEPROM. Such EEPROMs find use in particular in smart cards, so that the problem existing here relates in particular to smart cards.

In order to write a new record to a predetermined memory location, in particular the memory location receiving the oldest record within the ring memory, the content of said predetermined memory location must first be erased before the new data can be written. This is usually done by augmenting the pointer and writing the new record in successive steps. If there is an interruption in the write operation e.g. due to a power failure, the information of the new record might be lost, as well as the pointer information, which is even more serious since then there is no information information about the location where the next record is to be stored. Another problem relating to the pointer information is possible falsification of the pointer, for example when the pointer is being updated.

The prior art shows a number of suggestions for avoiding such errors in a ring memory. FR-A-2 699 704 describes a method for updating data in an EEPROM wherein a multi-digit flag is stored for each individual record. When a new record is to be written at the location of the "old" record, the old record including its flag is first erased. The new record is written at the location of the old record, the corresponding flag being set to a value stating that data updating is taking place. Then the flag of the previous current record is set to "old" and the flag of the new record indicating that updating is ongoing is set to "current." This method is intensive in terms of labor and memory space. If there is an interruption during the flag changeover after storage of the new record, there is no current record so that the state is indefinite.

EP-A-0 398 545 discloses a ring memory wherein a flag formed from one bit is present for each record. When a new record is written to the ring memory, the new record is marked after the write operation with a flag designating a current record, for example "1." Subsequently, the flag "1" belonging to the hitherto current record is set to "0." In this intermediate stage there are thus two flags with the value "1." This dilemma of the indefinite pointer flag for the current record is supposed to be overcome with the aid of the convention that in case of several flags with the value "1" the "upper" flag is always valid. Since flags consisting of single bits are already especially susceptible to write errors, faulty pointer data can very easily occur during updating of the pointer flag.

DE-A-196 50 993 discloses a ring memory provided with an additional memory location not recognizable from outside the interface of the ring memory. Upon a write operation the oldest record is always overwritten, followed by an updating of the pointer in such a way that the pointer then points to the new data item. In case of a disturbance, only the information of the oldest record is then lost but this is not recognizable from outside the interface. This memory system also involves the pos-involves the possibility of false pointer data arising from faulty writing of the pointer.

The invention is based on the problem of providing a method that permits safe writing of the pointer. Furthermore, a ring memory in conjunction with a safe pointer is to be provided.

For solving this problem according to claim 1, a further, redundant pointer is stored rather than a single pointer. In an especially preferred embodiment, the first and second, redundant pointer are written separately, in particular staggered in time, so that in case of a disturbance possibly occurring in the course of the writing of the two pointers at least one pointer comprises the correct pointer information. As a further inventive feature, the first and second pointers each have a check value. Said check value permits a faulty pointer to be recognized. A correction operation is possible by merely one write operation, that is, by copying the intact pointer.

Updating of the pointer is preferably effected in a first step while simultaneously forming the check value belonging to the first pointer. After comparison of the first, new pointer with the second pointer, the second pointer is optionally produced as a copy of the first pointer.

If a disturbance occurs during writing of the first and second pointers, for example a power failure during writing of an EEPROM, the first pointer might be already updated while the second pointer still has the old value. Depending on the time of the disturbance and the type of error, the original information of the first pointer can either be recovered from the second pointer, or the second pointer can be updated later in accordance with the first pointer.

The use of an additional, redundant pointer provides reliable protection against the formation of faulty pointer data in particular when the two pointers are written at separate times. Furthermore, this provides the possibility of reconstructing the particular desired pointer content in every situation, in particular in case of power failures at the time of pointer updating. The check value belonging to each pointer preferably consists of the complement of the code of the relevant memory location number. The pointer consists of the address or number of the current memory location; the check value is obtained by forming the complement.

In a special embodiment it is provided that a pointer consists of two bytes, the first byte (8 bits) containing the memory location code in a form comprising two hexadecimal numbers, and the second byte of the pointer containing the corresponding complementary hexadecimal code.

The preferred measures according to the invention provide a multiple redundancy that allows error detection and correction practically at any time. In particular, they create the possibility of reconstructing the pointer content in case of a disturbance in the form of a power failure.

The inventive method makes it possible to obtain virtually complete protection of the data with little additional effort for memory space for the second pointer and the check values and an additional write cycle for writing the second pointer. It is especially preferred to utilize these advantages in a smart card, which normally contains sensitive data requiring special protection.

In conjunction with the abovementioned measures, use is preferably also made of the measure of expanding the cyclic memory by one memory location, said additional memory location not being apparent from outside, that is, at the interface of the ring memory. The new record to be written is then written at the location of the oldest record so that in case of a disturbance only the oldest record is lost but this is not noticeable outwardly since only the predetermined number of memory locations without the additional memory location is present from outside.

In the following some examples of the invention will be explained in more detail with reference to the drawings, in which:

FIG. 1 shows a schematic view of the memory location for a first pointer and a second pointer of a ring memory;

FIG. 2 shows a ring memory having a predetermined number of memory locations, illustrating three phases of a write operation for a new record, each in conjunction with first and second pointer memory locations;

FIG. 3 shows a flowchart illustrating the operation of updating first and second pointers including a parity check; and FIG. 4 shows three consecutive phases during the writing of first and second pointers.

The examples described in the following relate specifically to an EEPROM with ring memory management. For writing a new record to the ring memory, current signals are fed to the EEPROM in the known way so as to change the state of the memory location addressed by the pointer. However, the invention is also applicable in conjunction with other ring memories, also in conjunction with virtual ring memories.

Reference shall first be made to FIG. 2, which shows on the left ring memory 10 designated I, where I is the first phase of a write operation.

Ring memory 10 contains n memory locations R1, R2, R3, . . . Rn. Each of said memory locations contains one record, designated D#1, D#2 . . . D#n following the numbering of the memory locations in FIG. 2. Pointer P points to the current, most recent record in a cyclic write operation, in the present example to record D#2 in memory location R2 under I in FIG. 2.

Below ring memory 10 on the left in FIG. 2, pointer P is schematically shown. Pointer P contains a first pointer stored in first pointer memory location RP1, as well as a redundant, second pointer stored in further pointer memory location RP2.

The first pointer consists of the actual pointer element, in the form of the code of the memory location address, designated P1 here. The further component of the first pointer is data item P1* complementary to P1 as a check value. The second pointer consists of a copy of the first pointer, P2 being again formed by the code of the memory location address and P2* being the complement of P2.

In the present case, a memory location address consists of a two-digit hexadecimal code. P1 has the value "02"; the complementary value is FD (the complementary hexadecimal or sedecimal numbers of 0, 1, 2, 3, . . . 9, A, B, C, D, E, F are F, E, D, . . . 3, 2, 1 and 0). FIG. 1 schematically shows the byte organization of pointer P in the two pointer memory locations RP1 and RP2. The first pointer memory location contains the two bytes b1 and b2, where b1 is the complement of b2 and vice versa. Second pointer memory location RP2 contains the two bytes b3 and b4, the relation again holding that b3 is the complement of b4 and vice versa.

With reference to the three phases I, II and III shown in FIG. 2 it will be explained in the following how a new record is written at the location of the oldest record. On the left in FIG. 2 pointer P points to memory location R2 containing record D#2. Due to the cyclic structure of ring memory 10 the oldest record is then contained in subsequent memory location R3 by definition. Record D#3 still stored there is to be overwritten. For this purpose the content of memory location R3 is first erased and then new record D'#3 written, as shown in the middle of FIG. 2 under II. When the write operation for new record D'#3 is over, pointer P is updated so that it then points to most recent current record D'#3, as indicated on the right in FIG. 2 under III.

On the bottom right in FIG. 2 the content of the two memory locations for the first and second pointers are shown. As one can see, the first pointer (P1=03; P1*=FC) points to third memory location R3 of the ring memory.

On the right in FIG. 2 the ring memory is designated 10' to make clear the peculiarity of an embodiment of the invention. According to this particular embodiment, ring memory 10' is expanded by one memory location compared to the other versions of the ring memory shown in FIG. 2, thus containing altogether R(n+1) memory locations. Viewed from outside the interface of the ring memory, however, ring memory 10' still contains n memory locations. The memory location used for writing the next record, on the right in FIG. 2, i.e. memory location R4, contains a record serving as a write buffer, that is, the oldest record, which is not accessible for reading from outside the ring memory. Upon a write operation as explained above, a new record is written to said memory location. In case of a disturbance, only these redundant data as the oldest data are lost.

As apparent from the pointers shown side by side at the bottom of FIG. 2, each comprising first pointer P1, P1* and second pointer P2, P2*, the updating of the pointer only takes place after the most recent record has been written, i.e. record D'#3 in the middle in FIG. 2.

If there is a disturbance, in particular a power failure, during writing, that is, updating of the pointer, the old or the new pointer can alternatively be reconstructed. This is schematically shown in FIG. 4.

FIG. 4 shows one below the other three phases during updating of the complete pointer. In stage "1" the old state of the pointer exists. In stage "2" first pointer P1, P1* is already augmented by one memory location address, thus being at "03" and "FC." In this stage the content of the second pointer still corresponds to the old value. In third stage "3" the data item of first pointer P1, P1* is then copied into the pointer memory location for the second pointer.

If a disturbance occurs in stage "2" the second pointer can be obtained from first pointer P1, P1* as the new second pointer. Alternatively, the old first pointer can be recovered from second pointer P2, P2*.

FIG. 3 shows a flowchart of the method for determining the current pointer value and checking it for correctness. In step S1, determination/check is initiated.

In following step S2 a query is effected on whether pointer P1 matches its check value, that is, in the present case its complement code P1*. In case of a match a comparison of the first with the second pointer is effected in step S3. In case of a mismatch the first pointer is copied completely into the second pointer in step S4.

In step S5 following step S4, the cyclic pointer which is used for the actual addressing of the relevant memory location is set at P1. The same happens if the comparison in step S3 shows that the two pointers P1 and P2 match.

In the case of a parity error in comparison step S2, a corresponding parity query is performed for the second pointer, step S6. If parity is fulfilled for second pointer P2, P2* the first pointer is corrected in step S7 by copying second pointer P2 including check value P2* into the first pointer. Then the code for P1 is again used for addressing the relevant memory location.

In case it is ascertained in step S6 that second pointer P2 also fails to contain a correct value, an error handling routine is initiated in step S8.

The above-described method for determining and checking the pointer values of first and second pointers each containing the complementary or inverse code as a check value is used in conjunction with ring memory 10 outlined in FIG. 2 preferably in the form of an EEPROM in smart cards.

What is claimed is:

1. A method for safe writing of a pointer (P) for records contained in individual memory locations (R1, R2, . . . ) of a ring memory (10; 10') comprising the steps of
   a) writing, in addition to a first pointer (P1, P1*), a second pointer (P2, P2*) redundant with respect to the first pointer; and
   b) expanding both the first and the second pointer by a check value.

2. The method according to claim 1, including writing first pointer (P1, P1*) and the second pointer (P2, P2*) separately from each other, and staggered in time.

3. The method according to claim 1 or 2, including determining or checking the current pointer by the following steps:
   a) checking the first pointer (P1) using the check value (P1*) (S2),
   b) comparing the first pointer with the second pointer (S3) if the first pointer (P1) is correct,
   c) copying the first pointer to obtain the new second pointer upon a mismatch of the two pointers during the comparison according to step b),
   d) checking the second pointer (P2) using the check value (P2*) (S6) if the first pointer (P1) is not correct,
   e) overwriting the first pointer (P1, P1*) with the value of the pointer (P2, P2*) (S7) if the second pointer is correct according to d).

4. A method for managing a ring memory (10; 10') using the method according to claim 1 or 2, wherein, for writing a new record (D'#3) to a predetermined memory location (R3) which cyclically follows the memory location (R2) designated by the pointer (P), writing the new record to the predetermined memory location (R3) and then writing an updated pointer.

5. The method according to claim 4, wherein before the new record (D'#3) is written to the predetermined memory cells the content of said cell is erased.

6. The method according to claim 4, wherein the predetermined memory location contains the oldest record in the ring memory (10') and is used as a write buffer.

7. The method according to claim 1, wherein each pointer consists of the code of the relevant memory location number, and the corresponding check value of the complement code of said memory location number.

8. A ring memory comprising a predetermined number of memory locations (R1, . . . Rn) each receiving one record (D#1, . . . ), and a pointer memory location to which a pointer is written which points to that memory location containing the current record (D#2), and a first pointer memory location (RP1) for a first pointer (P1, P1*) including a check value (P1*), and a second pointer memory location (RP2) for a second pointer (P2, P2*) redundant with respect to the first pointer and including a check value (P2*).

9. A ring memory according to claim 8 for use in a method according to claim 1.

10. A smart card having a ring memory according to claim 8 or 9.

* * * * *